(12) United States Patent
Rostovtsev

(10) Patent No.: US 8,278,651 B2
(45) Date of Patent: Oct. 2, 2012

(54) ELECTRONIC DEVICE INCLUDING 1,7-PHENANTHROLINE DERIVATIVE

(75) Inventor: Vsevolod Rostovtsev, Swarthmore, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 299 days.

(21) Appl. No.: 12/644,383

(22) Filed: Dec. 22, 2009

(65) Prior Publication Data

US 2010/0187510 A1    Jul. 29, 2010

Related U.S. Application Data

(60) Provisional application No. 61/139,828, filed on Dec. 22, 2008.

(51) Int. Cl.
*H01L 51/54* (2006.01)

(52) U.S. Cl. .................. 257/40; 257/E51.041

(58) Field of Classification Search .................. 257/40, 257/E51.041
See application file for complete search history.

(56) References Cited

U.S. PATENT DOCUMENTS
5,077,142 A    12/1991  Sakon et al.
(Continued)

FOREIGN PATENT DOCUMENTS
EP    341859 A1    11/1989
(Continued)

OTHER PUBLICATIONS

"Flexible light-emitting diodes made from soluble conducting polymer," Nature vol. 357, pp. 477 479 (Jun. 11, 1992).

(Continued)

*Primary Examiner* — Matthew W. Such
*Assistant Examiner* — Monica D Harrison

(57) ABSTRACT

There is provided an organic electronic device having an anode, a hole injection layer, a photoactive layer, an electron transport layer, and a cathode. At least one of the photoactive layer and the electron transport layer includes a compound having Formula I or Formula II

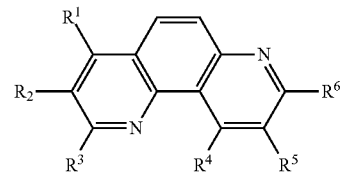

Formula I

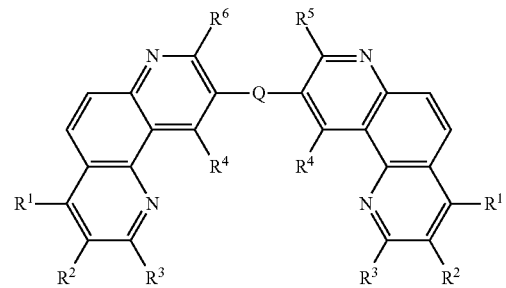

Formula II where:
$R^1$ through $R^6$ are the same or different and are independently selected from the group consisting of hydrogen, phenyl, biphenyl, naphthyl, naphthylphenyl, phenanthryl, triphenylamino, carbazolyl, and carbazolylphenyl; and
Q is an aryl group.
In Formula I, at least one of $R^1$ through $R^6$ is not hydrogen.

20 Claims, 1 Drawing Sheet

U.S. PATENT DOCUMENTS

| | | | |
|---|---|---|---|
| 5,393,614 A | 2/1995 | Nakada | |
| 6,303,238 B1 | 10/2001 | Thompson et al. | |
| 6,524,728 B1 | 2/2003 | Kijima et al. | |
| 6,670,645 B2 | 12/2003 | Grushin et al. | |
| 7,119,204 B2 | 10/2006 | Lecloux et al. | |
| 7,186,469 B2 | 3/2007 | Shibanuma et al. | |
| 2004/0102577 A1 | 5/2004 | Hsu et al. | |
| 2004/0127637 A1 | 7/2004 | Hsu et al. | |
| 2005/0205860 A1 | 9/2005 | Hsu et al. | |
| 2006/0017050 A1 | 1/2006 | Hasegawa et al. | |
| 2006/0115676 A1 | 6/2006 | Igawa et al. | |
| 2006/0134460 A1 | 6/2006 | Kondakova et al. | |
| 2006/0134464 A1 | 6/2006 | Nariyuki | |
| 2006/0204784 A1 | 9/2006 | Begley et al. | |
| 2007/0026257 A1 | 2/2007 | Begley et al. | |
| 2007/0037983 A1 | 2/2007 | Nomura et al. | |
| 2007/0122657 A1 * | 5/2007 | Klubek et al. | 428/690 |
| 2007/0176544 A1 | 8/2007 | Koike et al. | |
| 2009/0001327 A1 | 1/2009 | Werner et al. | |
| 2009/0162644 A1 | 6/2009 | Ricks et al. | |
| 2009/0242877 A1 | 10/2009 | Kondakov | |

FOREIGN PATENT DOCUMENTS

| | | |
|---|---|---|
| EP | 564224 A2 | 5/1997 |
| EP | 1013740 A2 | 6/2000 |
| EP | 1097981 A2 | 5/2001 |
| EP | 1786050 A1 | 5/2007 |
| EP | 2161272 A1 | 3/2010 |
| JP | 61041152 A | 2/1986 |
| JP | 2001110572 A | 4/2001 |
| JP | 2001267080 A | 9/2001 |
| JP | 2002352961 A | 12/2002 |
| WO | 00/70655 | 11/2000 |
| WO | 01/41512 A1 | 6/2001 |
| WO | 0230159 A1 | 4/2002 |
| WO | 0243449 A1 | 5/2002 |
| WO | 03/008424 A1 | 1/2003 |
| WO | 03/040257 A1 | 5/2003 |
| WO | 03/063555 A1 | 7/2003 |
| WO | 03079737 A2 | 9/2003 |
| WO | 03/091688 A2 | 11/2003 |
| WO | 2004/016710 A1 | 2/2004 |
| WO | 2006011090 A1 | 2/2006 |
| WO | 2007145979 A2 | 12/2007 |

OTHER PUBLICATIONS

Kirk-Othmer Encyclopedia of Chemical Technology, Fourth Edition, vol. 18, p. 837-860, 1996, by Y. Wang.

Dietrich-Buchecker et al., "Direct Synthesis of Disubstituted Aromatic Polyimine Chelates," Tetrahedron Letters, 1982, vol. 23 (50), pp. 5291-5294.

Dietrich-Buchecker, Christiane et al., Selective and efficient synthesis of di-, tri- and tetrasubstituted 1,10-phenanthrolines, Tetrahedron Letters, 1999, 3395-3396, 40, Elsevier Science Ltd.

Giebeler, C. et al., The photovoltaic effect in poly(p-phenylene-2,3'-bis(3,2'-diphenyl)-quinoxaline-7-7'-diyl), Optical Materials, Jan. 1998, 99-103, 9, Elsevier Science B.V.

Jin, Sung-Ho et al., Blue electroluminescence in blend of polymers containing carbazole and 1,3,4-oxadiazole units, Thin Solid Films, 2000, 255-258, 363, Elsevier Science S.A.

Limburg, W. et al., Electronic Transport Properties of Molecularly Doped Polymers—Some Substituted Triarylmethanes, Organic Coatings and Plastics, Chemistry, 1978, 534-539, 38.

Markus et al—Electronics and Nuleonics Dictionary, pp. 470-471 & 476 (McGraw-Hill 1966).

O'Brien, D. et al., Use of poly(phenyl quinoxaline) as an electron transport material in polymer light-emitting diodes, Appl. Phys. Lett., Aug. 12, 1996, 881-883, 69(7), American Institute of Physics.

Rehahn, Matthias et al, Synthesis, solution properties and conversion of poly(2,9-o-phenanthroline-alt-(2'5'-dihexyl)-4,4''-p-terphenylene)s into soluble, well-defined copper(I) and silver (I) complex polymers, Macromol. Chem. Phys., 1998, 127-140, 199, Huthig & Wepf Verlag, Zug.

Sun, Li-Xian et al., PVC membrane lithium-selective electrodes based on oligomethylene-bridged bis-1,10-phenanthroline derivatives, Analytica Chimica Acta, 1996, 57-64, 329, Elsevier Science B.V.

Yamamoto, Takakazu et al., Preparation and Properties of p-Conjugated Poly(1,10-phenanthroline03,8-diyl), Chemistry Letters, 1995, 785-786.

Yamamoto, Takakazu et al., Preparation of New Electron-Accepting-Conjugated Polyquinoxalines. Chemical and Electrochemical Reduction, Electrically Conducting Properties, and Use in Light-Emitting Diodes, J. Am. Chem. Soc., 1996, 3930-3937, 118, American Chemical Society.

Zotti et al., Electrochemical, Conductive and Magnetic Properties of 2,7-Carbazole-based Conjugated Polymers, Macromolecules, vol. 35, Feb. 7, 2002, pp. 2122-2128.

International Search Report, Korean Intellectual Property Office, Daejeong, KR; Application No. PCT/US2009/069184, PCT counterpart to U.S. Appl. No. 12/644,362; Hyun Shik Oh, Authorized Officer, 20100805.

* cited by examiner

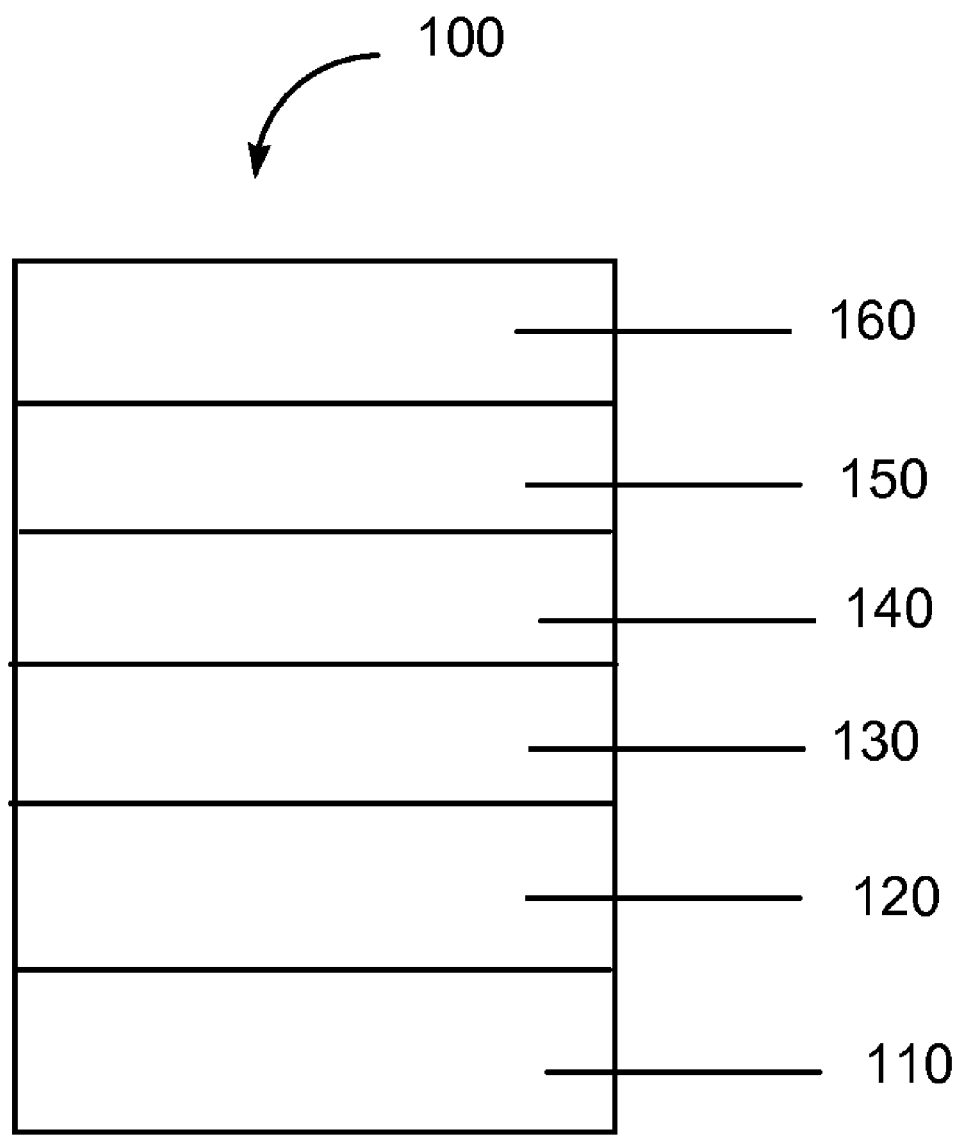

ELECTRONIC DEVICE INCLUDING 1,7-PHENANTHROLINE DERIVATIVE

RELATED APPLICATION

This application claims priority under 35 U.S.C. §119(e) from Provisional Application No. 61/139,828 filed Dec. 22, 2008 which is incorporated by reference in its entirety.

BACKGROUND INFORMATION

1. Field of the Disclosure

This disclosure relates in general to organic electronic devices including at least one layer having a 1,7-phenanthroline derivative.

2. Description of the Related Art

In organic photoactive electronic devices, such as organic light emitting diodes ("OLED"), that make up OLED displays, the organic active layer is sandwiched between two electrical contact layers in an OLED display. In an OLED, the organic photoactive layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used.

Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode. Charge transport materials can also be used as hosts in combination with the photoactive materials.

There is a continuing need for new materials for electronic devices.

SUMMARY

There is provided an organic electronic device comprising an anode, a hole injection layer, a photoactive layer, an electron transport layer, and a cathode, wherein at least one of the photoactive layer and the electron transport layer comprises a compound having Formula I or Formula II

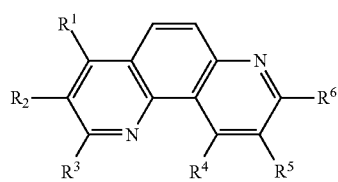

Formula I

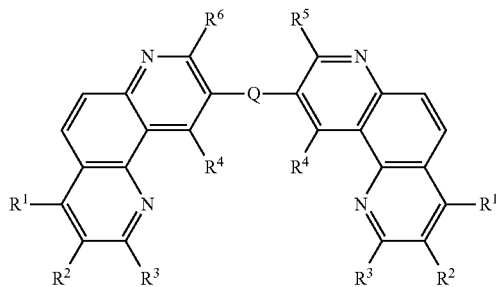

Formula II where:
R$^1$ through R$^6$ are the same or different and are independently selected from the group consisting of hydrogen, phenyl, biphenyl, naphthyl, naphthylphenyl, phenanthryl, triphenylamino, carbazolyl, and carbazolylphenyl; and Q is an aryl group;
with the proviso that in Formula I at least one of R$^1$ through R$^6$ is not hydrogen.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

FIG. 1 includes an illustration of an exemplary organic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Phenanthroline Derivatives, the Electronic Device, and finally Examples.

1. Definitions and Clarification of Terms

Before addressing details of embodiments described below, some terms are defined or clarified.

The term "alkyl" is intended to mean a group derived from an aliphatic hydrocarbon.

The term "aryl" is intended to mean a group derived from an aromatic hydrocarbon. The term "aromatic compound" is intended to mean an organic compound comprising at least one unsaturated cyclic group having delocalized pi electrons. The term is intended to encompass both aromatic compounds having only carbon and hydrogen atoms, and heteroaromatic compounds wherein one or more of the carbon atoms within the cyclic group has been replaced by another atom, such as nitrogen, oxygen, sulfur, or the like.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport material facilitate negative charge. Although light-emitting materials may also have some charge transport properties, the term "charge transport layer, material, member, or structure" is not intended to include a layer, material, member, or structure whose primary function is light emission.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material.

The term "host material" is intended to mean a material, usually in the form of a layer, to which a dopant may or may not be added. The host material may or may not have electronic characteristic(s) or the ability to emit, receive, or filter radiation.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

The term "organic electronic device," or sometimes just "electronic device," is intended to mean a device including one or more organic semiconductor layers or materials.

The term "photoactive" is intended to mean a material or layer that emits light when activated by an applied voltage (such as in a light emitting diode or chemical cell) or responds to radiant energy and generates a signal with or without an applied bias voltage (such as in a photodetector).

Unless otherwise indicated, all groups can be unsubstituted or substituted. Unless otherwise indicated, all groups can be linear, branched or cyclic, where possible. In some embodiments, the substituents are selected from the group consisting of alkyl, alkoxy, and aryl.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. 1,7-Phenanthroline Derivatives

Electron transport materials have been used as host materials in photoactive layers and in electron transport layers. Electron transport materials based on metal complexes of quinoline ligands, such as with Al, Ga, or Zr, have been used in these applications. However, there are several disadvantages. The complexes can have poor atmospheric stability when used as hosts. It is difficult to plasma clean fabricated parts employing such metal complexes. The low triplet energy leads to quenching of phosphorescent emission of >2.0 eV energy. 1,10-Phenanthroline materials have also been used as electron transport materials. However, processing characteristics, especially solubility, are frequently unsatisfactory for some applications as a host material.

The 1,7-phenanthroline derivatives described herein have new substitution patterns over previously reported materials and a general synthetic approach to the diverse substitution arrangements has been developed. In some embodiments, the 1,7-phenanthroline derivatives are useful as solution processible electron dominated hosts for OLED devices or as electron transport materials suitable for n-doping in OLED devices having a thick electron transport layer. The resulting devices have low current leakage. The good electron mobility and high Tg allow for devices with long lifetimes and high efficiency. In some embodiments, the materials are useful in any printed electronics application including photovoltaics and TFTs.

The new 1,7-phenanthroline derivatives can have enhanced solubility, high thermal stability (high Tg>100 C) and good electron mobility. The compounds demonstrate good air stability. They can be used as electron transport materials for n-doped OLED devices as well as electron dominated hosts (for both fluorescent and phosphorescent emitters) for emissive layers in solution processed OLED devices.

a. Formula I

In some embodiments, the 1,7-phenanthroline derivative compounds described herein have Formula I

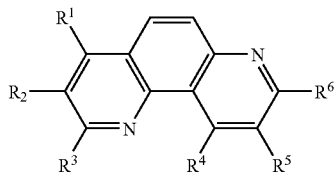

Formula I where:
  R$^1$ through R$^6$ are the same or different and are independently selected from the group consisting of hydrogen, phenyl, biphenyl, naphthyl, naphthylphenyl, phenanthryl, triphenylamino, carbazolyl, and carbazolylphenyl;

with the proviso that at least one of R$^1$ through R$^6$ is not hydrogen.

The groups referred to above are defined as follows, where the dashed lines represent possible points of attachment.

biphenyl:

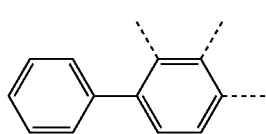

naphthyl:

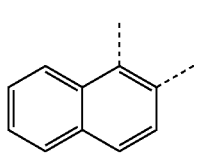

naphthylphenyl:

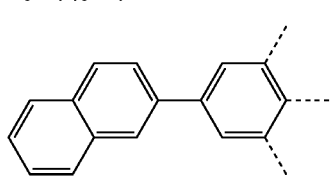

phenanthryl:

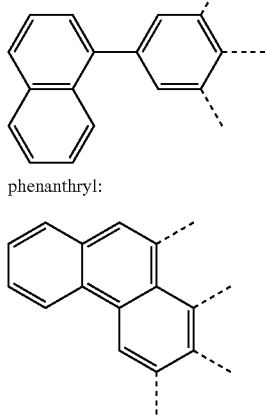

triphenylamino:

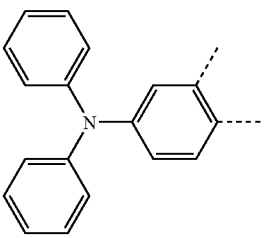

carbazolylphenyl:

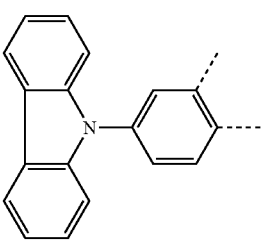

In some embodiments, R$^1$ through R$^4$ and R$^6$ are hydrogen. Examples of these are Compounds 1-5 shown below.

Compound 1

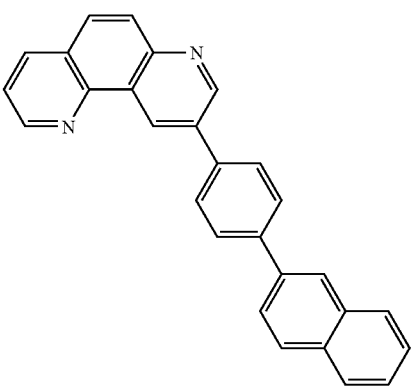

Compound 2

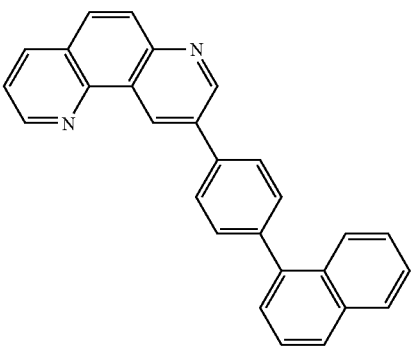

Compound 3

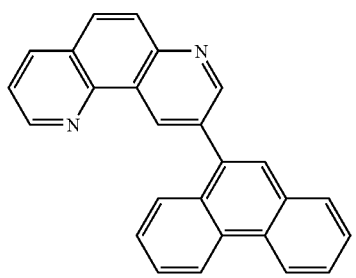

Compound 4

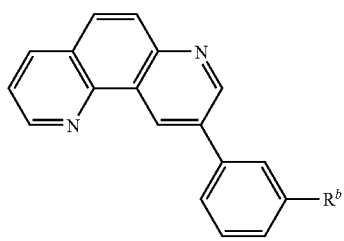

Compound 4a: $R^a$ = methyl
Compound 4b: $R^a$ = t-butyl
Compound 4c: $R^a$ = triphenylsilane Compound 5

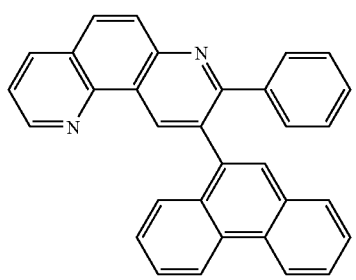

Compound 5a: $R^b$ = methyl
Compound 5b: $R^b$ = t-butyl
Compound 5c: $R^b$ = triphenylsilane In some embodiments, R5 is not hydrogen and at least one of R1 through R4 and R6 is not hydrogen. Examples of these are Compounds 6 and 7 shown below.

Compound 6

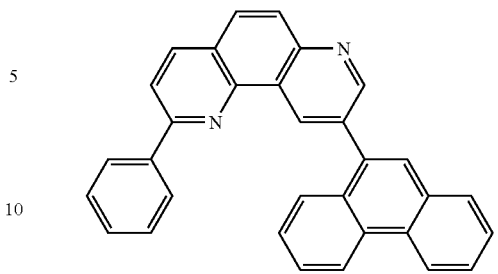

Compound 7

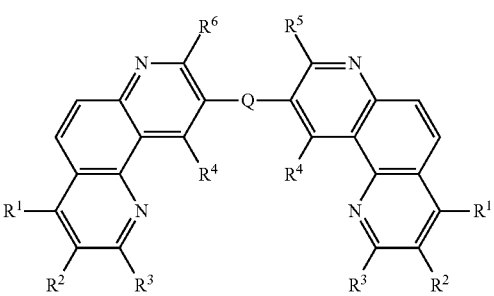

b. Formula II

In some embodiments, the 1,7-phenanthroline compounds described herein have Formula II Formula II where:

$R^1$ through $R^6$ are the same or different and are independently selected from the group consisting of hydrogen, phenyl, biphenyl, naphthyl, naphthylphenyl, phenanthryl, triphenylamino, carbazolyl, and carbazolylphenyl; and Q is an aryl group.

In some embodiments, Q is selected from the group consisting of phenylene, naphthylene, biphenylene, and binaphthylene. In some embodiments, Q is selected from the group consisting of 1,4-phenylene, 2,6-naphthylene, 4,4'-biphenylene, and 4,4'-(1,1'-binaphthylene).

In some embodiments, the two 1,7-phenanthroline units are the same. In some embodiments, they are different.

In some embodiments, all R groups are hydrogen.

Examples of materials having Formula II are Compounds 8 and 9 shown below.

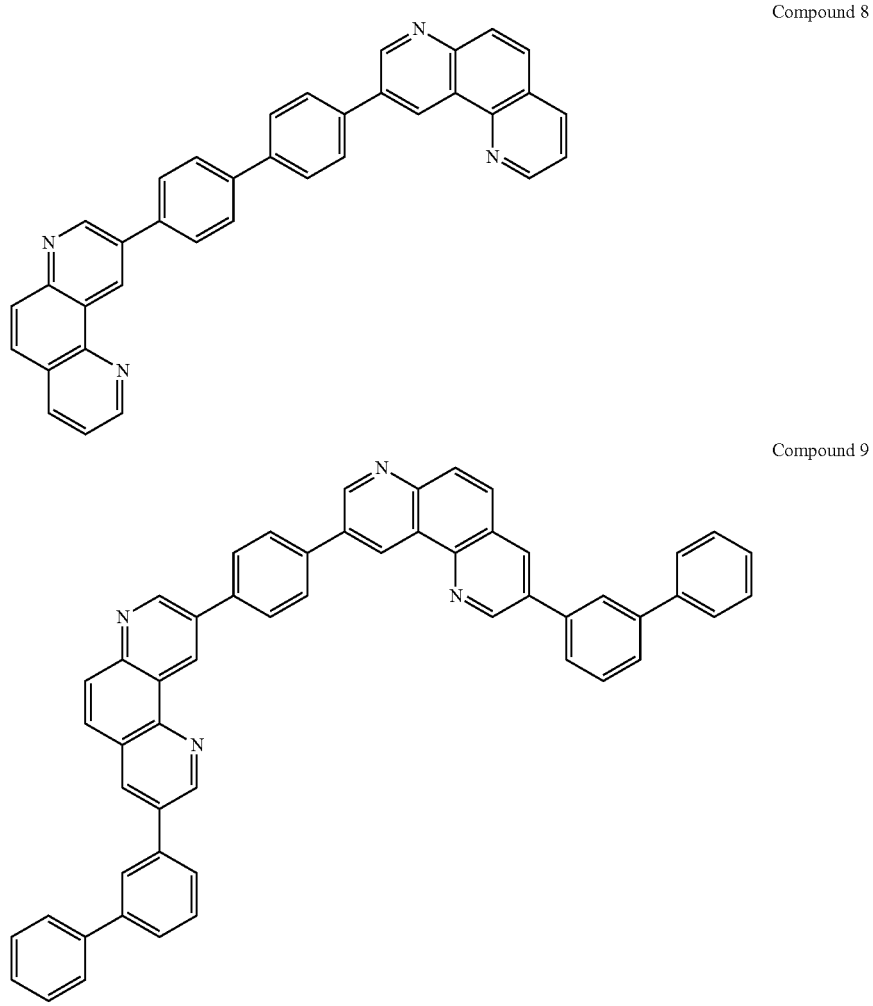

Compound 8

Compound 9

The 1,7-phenanthroline compounds having Formulae I and II can be made by known synthetic techniques. In some embodiments, the compounds are made by Suzuki coupling of halo phenanthrolines with the boronic acid analog of the desired substituent or linking group. This is further illustrated in the examples.

3. Electronic Device

Organic electronic devices that may benefit from having one or more layers comprising the blue luminescent materials described herein include, but are not limited to, (1) devices that convert electrical energy into radiation (e.g., a light-emitting diode, light emitting diode display, or diode laser), (2) devices that detect signals through electronics processes (e.g., photodetectors, photoconductive cells, photoresistors, photoswitches, phototransistors, phototubes, IR detectors), (3) devices that convert radiation into electrical energy, (e.g., a photovoltaic device or solar cell), and (4) devices that include one or more electronic components that include one or more organic semi-conductor layers (e.g., a transistor or diode).

One illustration of an organic electronic device structure is shown in FIG. 1. The device 100 has a first electrical contact layer, an anode layer 110 and a second electrical contact layer, a cathode layer 160, and a photoactive layer 140 between them. Adjacent to the anode is a buffer layer 120. Adjacent to the buffer layer is a hole transport layer 130, comprising hole transport material. Adjacent to the cathode may be an electron transport layer 150, comprising an electron transport material. As an option, devices may use one or more additional hole injection or hole transport layers (not shown) next to the anode 110 and/or one or more additional electron injection or electron transport layers (not shown) next to the cathode 160.

Layers 120 through 150 are individually and collectively referred to as the active layers.

In one embodiment, the different layers have the following range of thicknesses: anode 110, 500-5000 Å, in one embodiment 1000-2000 Å; buffer layer 120, 50-2000 Å, in one embodiment 200-1000 Å; hole transport layer 130, 50-2000 Å, in one embodiment 200-1000 Å; photoactive layer 140, 10-2000 Å, in one embodiment 100-1000 Å; layer 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. The desired ratio of layer thicknesses will depend on the exact nature of the materials used.

Depending upon the application of the device 100, the photoactive layer 140 can be a light-emitting layer that is activated by an applied voltage (such as in a light-emitting diode or light-emitting electrochemical cell), or a layer of material that responds to radiant energy and generates a signal with or without an applied bias voltage (such as in a photodetector). Examples of photodetectors include photoconductive cells, photoresistors, photoswitches, phototransistors, and phototubes, and photovoltaic cells, as these terms are described in Markus, John, *Electronics and Nucleonics Dictionary*, 470 and 476 (McGraw-Hill, Inc. 1966).

a. Photoactive Layer

The 1,7-phenanthroline compounds of Formulae I and II are useful as host materials for photoactive materials in layer 140. The compounds can be used alone, or in combination with another host material. In some embodiments, the 1,7-phenanthroline compounds are used as a host for blue emissive dopant materials. The ratio of host to dopant is generally in the range of 5:1 to 25:1; in some embodiments, from 10:1 to 20:1.

In some embodiments, the photoactive dopant materials are electroluminescent and are selected from materials which have red, green and blue emission colors. Electroluminescent materials include small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (AlQ); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In some embodiments, the photoactive dopant is a cyclometalated complex of iridium. In some embodiments, the complex has two ligands selected from phenylpyridines, phenylquinolines, and phenylisoquinolines, and a third ligand with is a β-dienolate. The ligands may be unsubstituted or substituted with F, D, alkyl, CN, or aryl groups.

In some embodiments, the photoactive dopant is a polymer selected from the group consisting of poly(phenylenevinylenes), polyfluorenes, and polyspirobifluorenes.

In some embodiments, the photoactive dopant is selected from the group consisting of a non-polymeric spirobifluorene compound and a fluoranthene compound.

In some embodiments, the photoactive dopant is a compound having aryl amine groups. In some embodiments, the photoactive dopant is selected from the formulae below:

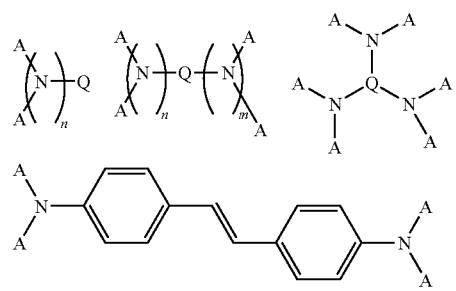

where:

A is the same or different at each occurrence and is an aromatic group having from 3-60 carbon atoms;

Q is a single bond or an aromatic group having from 3-60 carbon atoms;

n and m are independently an integer from 1-6.

In some embodiments of the above formula, at least one of A and Q in each formula has at least three condensed rings. In some embodiments, m and n are equal to 1.

In some embodiments, Q is a styryl or styrylphenyl group.

In some embodiments, Q is an aromatic group having at least two condensed rings. In some embodiments, Q is selected from the group consisting of naphthalene, anthracene, chrysene, pyrene, tetracene, xanthene, perylene, coumarin, rhodamine, quinacridone, and rubrene.

In some embodiments, A is selected from the group consisting of phenyl, tolyl, naphthyl, and anthracenyl groups.

In some embodiments, the photoactive dopant has the formula below:

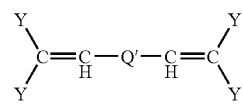

where:

Y is the same or different at each occurrence and is an aromatic group having 3-60 carbon atoms;

Q' is an aromatic group, a divalent triphenylamine residue group, or a single bond.

In some embodiments, the photoactive dopant is an aryl acene. In some embodiments, the photoactive dopant is a non-symmetrical aryl acene.

In some embodiments, the photoactive dopant is a chrysene derivative. The term "chrysene" is intended to mean 1,2-benzophenanthrene. In some embodiments, the photoactive dopant is a chrysene having aryl substituents. In some embodiments, the photoactive dopant is a chrysene having arylamino substituents. In some embodiments, the photoactive dopant is a chrysene having two different arylamino substituents. In some embodiments, the chrysene derivative has a deep blue emission.

In some embodiments, the photoactive dopant is selected from the group consisting of E1 through E8 shown below.

E1
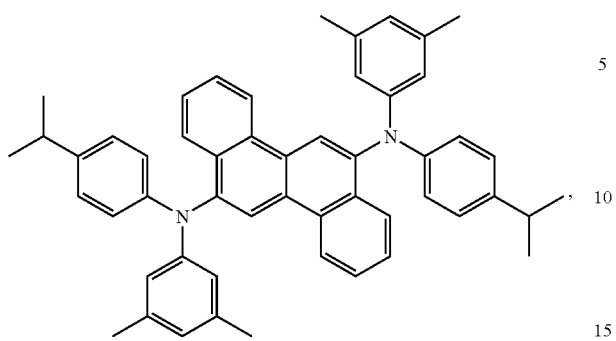
E2
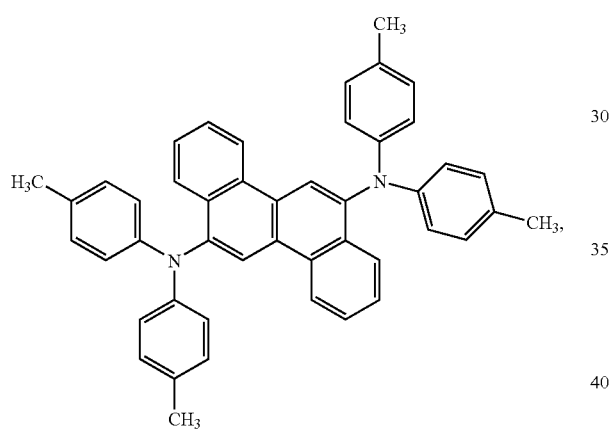
E3
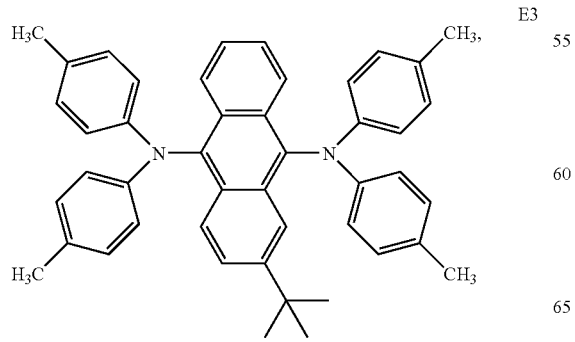
E4
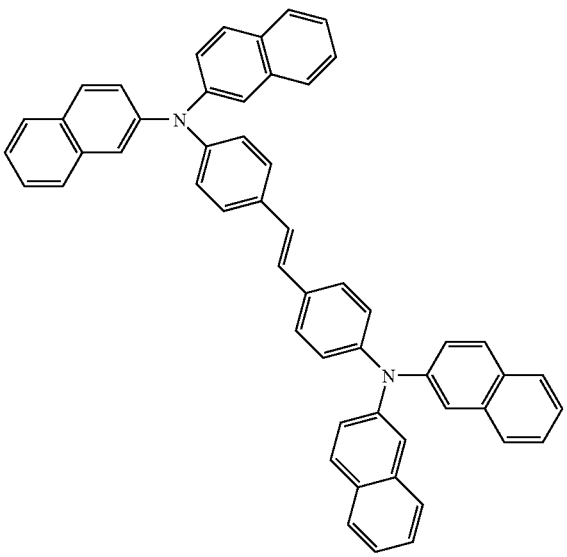
E5
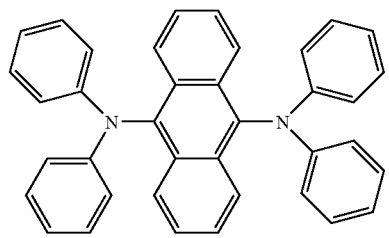
E6
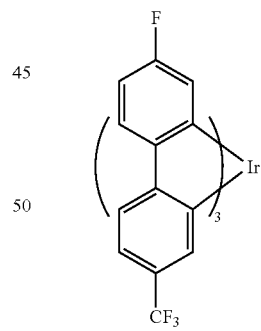
E7
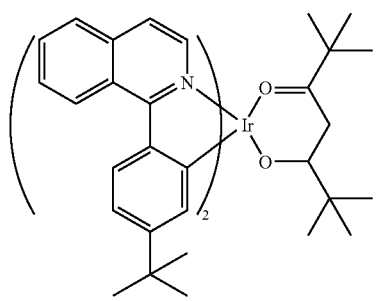

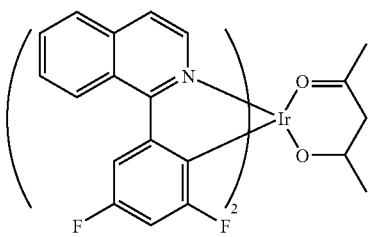

In some embodiments, the 1,7-phenanthroline derivative compound is used with an additional host material. In some embodiments, the 1,7-phenanthroline derivative compound is not used as a host in the photoactive layer. Examples of other types of hosts which can be used alone or in combination with the 1,7-phenanthroline compounds, include, but are not limited to, bis-condensed cyclic aromatic compounds and anthracene derivatives.

In some embodiments the anthracene host compound has the formula:

An-L-An where:
An is an anthracene moiety;
L is a divalent connecting group.

In some embodiments of this formula, L is a single bond, —O—, —S—, —N(R)—, or an aromatic group. In some embodiments, An is a mono- or diphenylanthryl moiety.

In some embodiments, the anthracene host has the formula:

A-An-A where:
An is an anthracene moiety;
A is the same or different at each occurrence and is an aromatic group.

In some embodiments, the A groups are attached at the 9- and 10-positions of the anthracene moiety. In some embodiments, A is selected from the group consisting naphthyl, naphthylphenylene, and naphthylnaphthylene. In some embodiments the compound is symmetrical and in some embodiments the compound is non-symmetrical.

In some embodiments, the anthracene host has the formula:

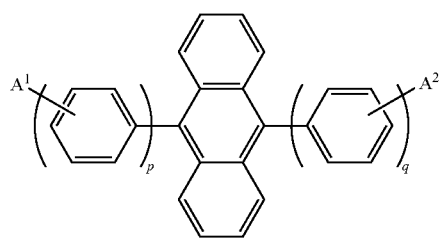

where:
$A^1$ and $A^2$ are the same or different at each occurrence and are selected from the group consisting of H, an aromatic group, and an alkenyl group, or A may represent one or more fused aromatic rings;
p and q are the same or different and are an integer from 1-3. In some embodiments, the anthracene derivative is non-symmetrical. In some embodiments, p=2 and q=1. In some embodiments, at least one of $A^1$ and $A^2$ is a naphthyl group.

In some embodiments, the host is selected from the group consisting of

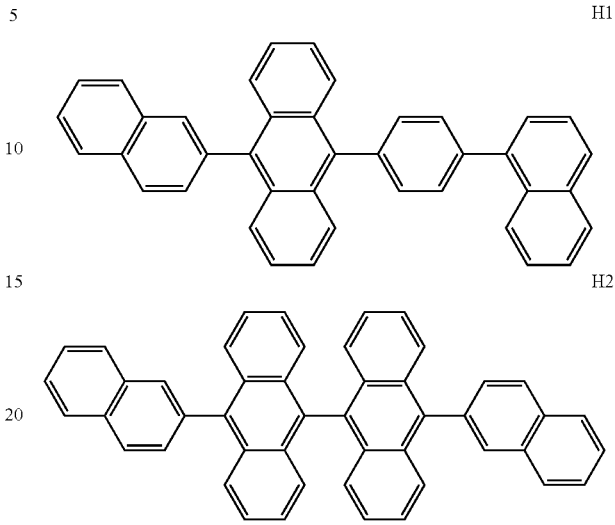

and combinations thereof.

b. Electron Transport Layer

The 1,7-phenanthroline compounds of Formulae I and II are useful as electron transport materials in layer 150. The compounds can be used alone, or in combination with another electron transport material.

Examples of other electron transport materials which can be used alone or in combination with the 1,7-phenanthroline compounds include, but are not limited to, metal chelated oxinoid compounds, including metal quinolate derivatives such as tris(8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof.

c. Other Device Layers

The other layers in the device can be made of any materials that are known to be useful in such layers.

The anode 110, is an electrode that is particularly efficient for injecting positive charge carriers. It can be made of, for example, materials containing a metal, mixed metal, alloy, metal oxide or mixed-metal oxide, or it can be a conducting polymer, or mixtures thereof. Suitable metals include the Group 11 metals, the metals in Groups 4-6, and the Group 8-10 transition metals. If the anode is to be light-transmitting, mixed-metal oxides of Groups 12, 13 and 14 metals, such as indium-tin-oxide, are generally used. The anode 110 can also comprise an organic material such as polyaniline as described in "Flexible light-emitting diodes made from soluble conducting polymer," Nature vol. 357, pp 477-479 (11 Jun. 1992). At least one of the anode and cathode is desirably at least partially transparent to allow the generated light to be observed.

The buffer layer 120 comprises buffer material and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer materials may be polymers, oligomers, or small molecules. They may be vapour deposited or deposited from liquids which may be in the form of solutions, dispersions, suspensions, emulsions, colloidal mixtures, or other compositions.

The buffer layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like.

The buffer layer can comprise charge transfer compounds, and the like, such as copper phthalocyanine and the tetrathiafulvalene-tetracyanoquinodimethane system (TTF-TCNQ).

In some embodiments, the buffer layer comprises at least one electrically conductive polymer and at least one fluorinated acid polymer. Such materials have been described in, for example, published U.S. patent applications 2004-0102577, 2004-0127637, and 2005/205860

Examples of hole transport materials for layer 130 have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (α-NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamin polymers are used, especially triarylamine-fluorene copolymers. In some cases, the polymers and copolymers are crosslinkable.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, and Li$_2$O can also be deposited between the organic layer and the cathode layer to lower the operating voltage.

It is known to have other layers in organic electronic devices. For example, there can be a layer (not shown) between the anode 110 and buffer layer 120 to control the amount of positive charge injected and/or to provide bandgap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of anode layer 110, active layers 120, 130, 140, and 150, or cathode layer 160, can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

d. Device Fabrication

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the device is fabricated by liquid deposition of the buffer layer, the hole transport layer, and the photoactive layer, and by vapor deposition of the anode, the electron transport layer, an electron injection layer and the cathode.

EXAMPLES

The concepts described herein will be further described in the following examples, which do not limit the scope of the invention described in the claims.

Example 1

This example illustrates the synthesis of Compound 8.

To 2.6 g of bromo-phenanthroline A, shown below, (10 mM) in a glove box was added 1.21 g (5 mM) di-boronic acid B, shown below.

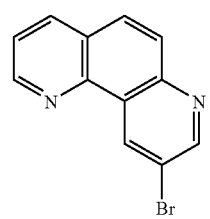

A

-continued

B

To this was added 0.3 g tris(dibenzylideneacetone)dipalladium (0) (0.3 mM), 0.2 g tricyclohexylphosphine (0.7 mM) and 7.5 g potassium phosphate (35 mM), and all were dissolved into 60 mL dioxane and 30 mL water. This was mixed and heated in a glove box at 100° C. for 1 hr and then warmed gently (minimum rheostat setting) under nitrogen overnight. When the temperature had reached about 80° C., a tan brown slurry had been formed. As the solution refluxed (air condensor), a white powdery precipitate formed. After cooling and removing from the glove box, the separate water layer was extracted with dichloromethane. The organic layers were dried over magnesium sulfate and filtered through a silica plug eluting with dichloromethane and then ethyl acetate. The product was identified as Compound 8.

Compound 8

Example 2

Compounds 2 and 3 are made in an analogous manner using p-(1-naphthyl)phenylboronic acid and 9-phenanthreneboronic acid, respectively.

Example 3

This example illustrates the use of the 1,7-phenanthroline compounds in the electron transport layer of an OLED device.

The following materials were used:
anode=Indium Tin Oxide (ITO), 50 nm
hole injection layer (HIL)=Buffer 1, which is an aqueous dispersion of an electrically conductive polymer and a polymeric fluorinated sulfonic acid. Such materials have been described in, for example, published U.S. patent applications US 2004/0102577, US 2004/0127637, and US 2005/0205860.
hole transport layer (HTL)=N,N'-bis(naphthalen-1-yl)-N, N'-bis-(phenyl)benzidine (NPB); 25 nm
photoactive layer (PAL)=host H1 with 8% by weight of dopant E1; 32.4 nm
electron transport layer (ETL)=the phenanthroline compound listed below in the table
electron injection layer (EIL)=LiF, 1 nm
cathode=Al, 100 nm The buffer material was applied by spin-coating. The other layers were applied by vapor deposition.

The device thicknesses and results are summarized in Table 1 below.

TABLE 1

Device Results

| Ex. | ETL | Buffer, nm | EQE @1000 nits | Color (x, y) @1000 nits |
|---|---|---|---|---|
| 3-1 | Cmpd. 2 | 49.0 | 5.66% | (0.142, 0.198) |
| 3-2 | Cmpd. 3 | 49.0 | 5.0% | (0.143, 0.214) |
| 3-3 | Cmpd. 8 | 51.0 | 4.72% | (0.144, 0.225) |

EQE = external quantum efficiency; x and y refer to color coordinates according to the C.I.E. chromaticity scale (Commission Internationale de L'Eclairage, 1931).

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An organic electronic device comprising an anode, a hole injection layer, a photoactive layer, an electron transport layer, and a cathode, wherein at least one of the photoactive layer and the electron transport layer comprises a compound having Formula I or Formula II Formula I

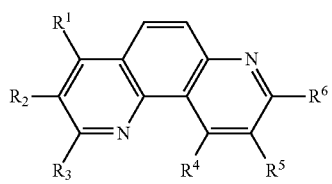

Formula II

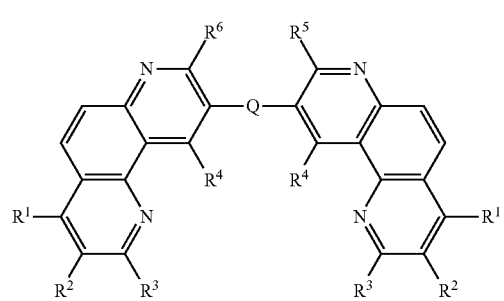

where:
- R¹ through R⁶ are the same or different and are independently selected from the group consisting of hydrogen, phenyl, biphenyl, naphthyl, naphthylphenyl, phenanthryl, triphenylamino, carbazolyl, and carbazolylphenyl; and
- Q is an aryl group selected from the group consisting of phenylene, naphthylene, biphenylene, and binaphthylene;

with the proviso that in Formula I at least one of R¹ through R⁶ is not hydrogen.

2. A device as in claim 1 wherein the at least one of the electron transport layer and the photoactive layer comprises a compound having a formula selected from the following:

Compound 1

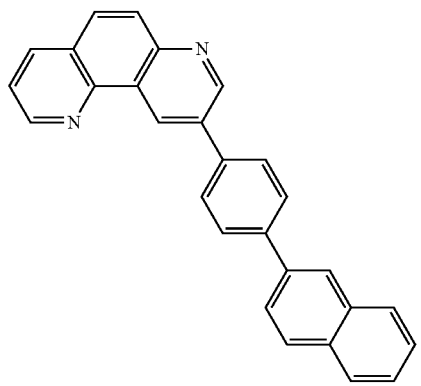

Compound 2

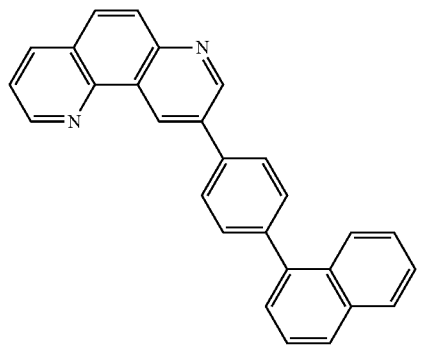

Compound 3

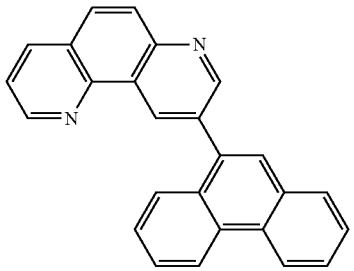

Compound 4

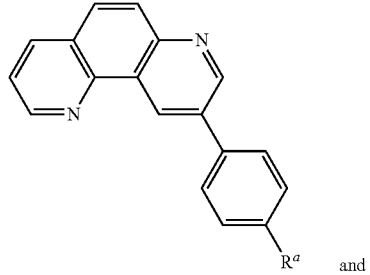

Compound 4a: $R^a$ = methyl
Compound 4b: $R^a$ = t-butyl
Compound 4c: $R^a$ = triphenylsilane Compound 5

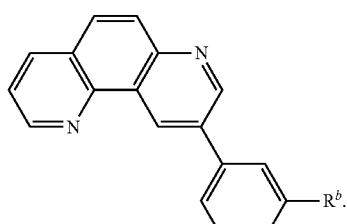

Compound 5a: $R^b$ = methyl
Compound 5b: $R^b$ = t-butyl
Compound 5c: $R^b$ = triphenylsilane 3. A device as in claim 1 wherein the at least one of the electron transport layer and the photoactive layer comprises a compound having a formula selected from the following:

Compound 8

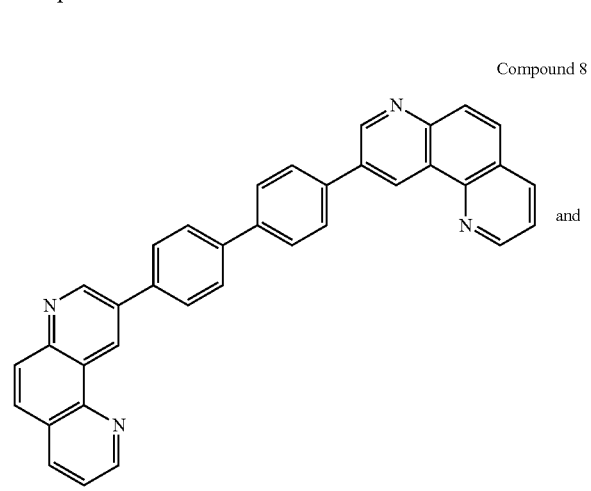

and

Compound 9

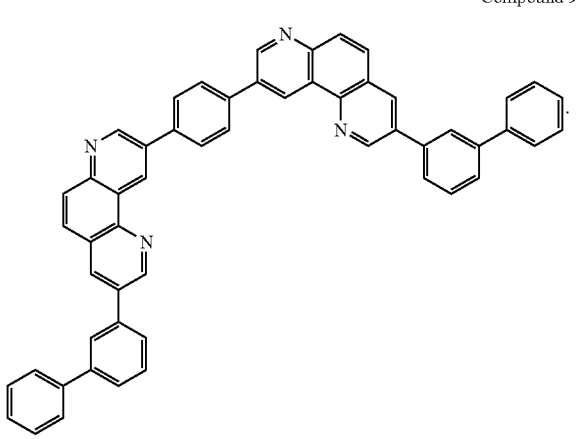

4. A device as in claim 1 wherein the at least one of the electron transport layer and the photoactive layer comprises a compound having a formula selected from the following:

Compound 6

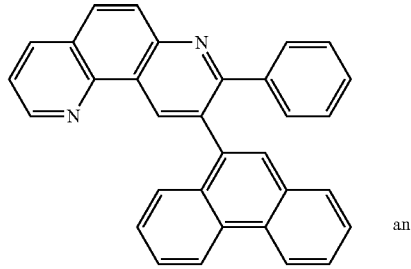

and

Compound 7

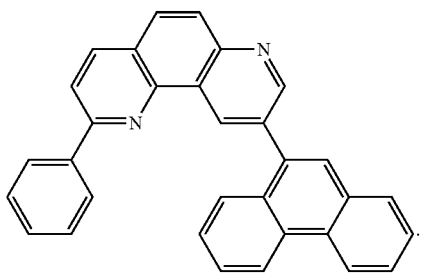

5. A device as in claim 1 wherein the electron transport layer comprises a compound having Formula I or Formula II.

6. A device as in claim 1 wherein the photoactive layer comprises a photoactive dopant and a compound having Formula I or Formula II.

7. A device as in claim 5 or 6 wherein the photoactive layer comprises a dopant having a formula selected from:

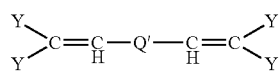

where:
Y is the same or different at each occurrence and is an aromatic group having 3-60 carbon atoms;

Q' is an aromatic group, a divalent triphenylamine residue group, or a single bond.

8. A device as in claim 5 or 6 wherein the photoactive layer comprises a dopant having a formula selected from:

E1

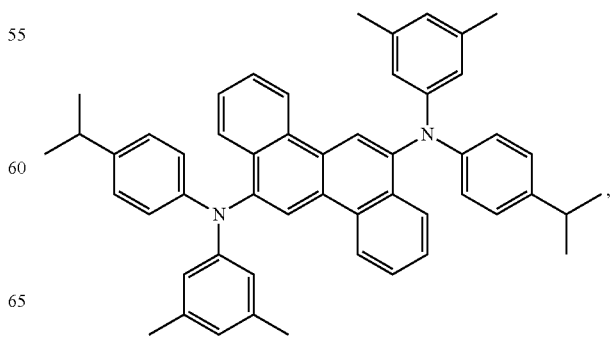

-continued

E2
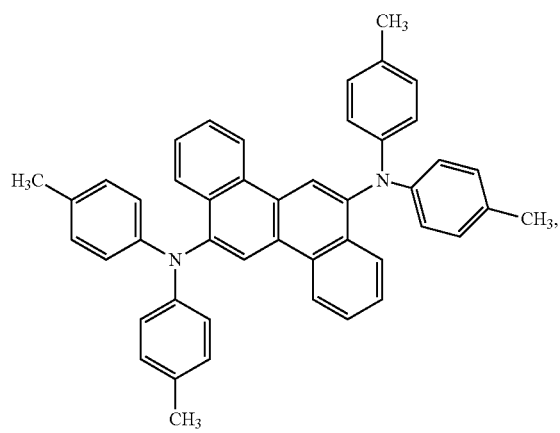

E3
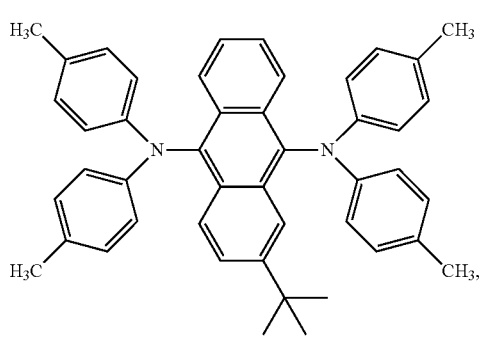

E4
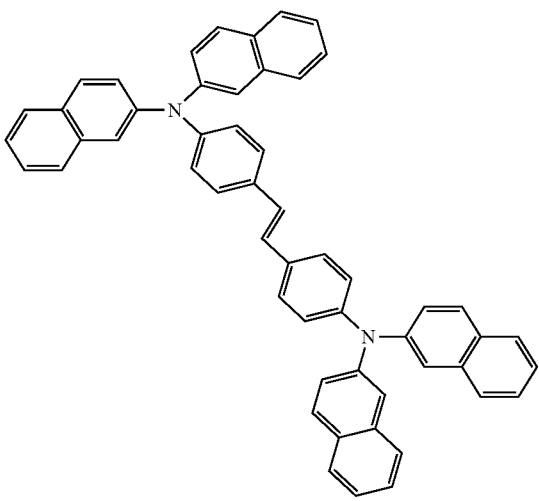

E5
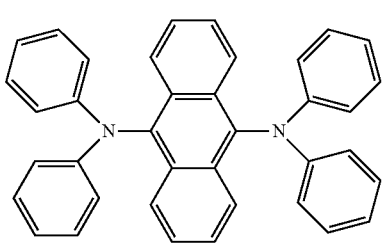

-continued

E6
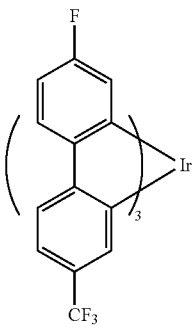

E7
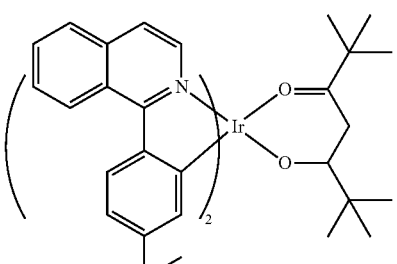

E8
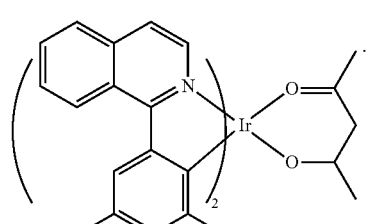

9. A device as in claim 5 wherein the photoactive layer further comprises a host material selected from bis-condensed cyclic aromatic compounds and anthracene derivatives.

10. A device as in claim 9 wherein the photoactive layer comprises a host having a formula selected from the following:

An-L-An where:
An is an anthracene moiety;
L is a divalent connecting group; and A-An-A where:
An is an anthracene moiety;
A is the same or different at each occurrence and is an aromatic group.

11. A device as in claim 5 wherein the electron transport layer further comprises metal chelated oxinoid compounds including metal quinolate derivatives such as tris(8-hydroxyquinolato)aluminum (AlQ), bis(2-methyl-8-quinolinolato) (p-phenylphenolato) aluminum (BAlq), tetrakis-(8-hydroxyquinolato)hafnium (HfQ) and tetrakis-(8-hydroxyquinolato)zirconium (ZrQ); and azole compounds including 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), 1,3,5-tri(phenyl-2-benzimidazole) benzene (TPBI); quinoxaline derivatives including 2,3-bis(4-fluorophenyl)quinoxaline; phenanthrolines including 4,7- diphenyl-1,10-phenanthroline (DPA) and 2,9-dimethyl-4,7-diphenyl-1,10-phenanthroline (DDPA); and mixtures thereof.

12. A device as in claim 5 or 6 wherein the photoactive layer comprises a dopant having a formula selected from:

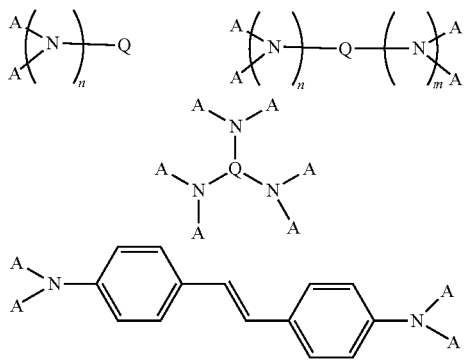

where:

A is the same or different at each occurrence and is an aromatic group having from 3-60 carbon atoms;

Q is a single bond or an aromatic group having from 3-60 carbon atoms;

n and m are independently an integer from 1-6.

13. A device as in claim 6 wherein the photoactive layer further comprises an additional host.

14. A device as in claim 13 wherein the additional host material comprises a material selected from bis-condensed cyclic aromatic compounds and anthracene derivatives.

15. A device as in claim 14 wherein the anthracene derivative has a formula selected from the following:

An-L-An where:
An is an anthracene moiety;
L is a divalent connecting group; and A-An-A where:
An is an anthracene moiety;
A is the same or different at each occurrence and is an aromatic group.

16. A device as in claim 15, wherein, with respect to the formula An-L-An, L is a single bond, —O—, —S—, —N(R)—, or an aromatic group.

17. A device as in claim 16 wherein An is a mono- or diphenylanthryl moiety.

18. A device as in claim 16 wherein the anthracene host having general formula A-an-A has the formula:

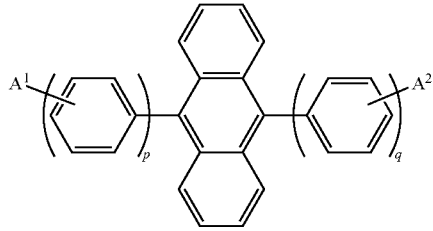

where:
$A^1$ and $A^2$ are the same or different at each occurrence and are selected from the group consisting of H, an aromatic group, and an alkenyl group, or A may represent one or more fused aromatic rings;
p and q are the same or different and are an integer from 1-3.

19. A device as in claim 6 wherein the ratio of host to dopant is in the range of from 5:1 to 25:1.

20. A device as in claim 6 wherein the ratio of host to dopant is in the range of from 10:1 to 20:1.

* * * * *